(12) United States Patent
Bushnell et al.

(10) Patent No.: US 9,454,188 B2
(45) Date of Patent: Sep. 27, 2016

(54) ELECTRONIC DEVICE STRUCTURES JOINED USING SHRINKING AND EXPANDING ATTACHMENT STRUCTURES

(71) Applicant: Apple Inc., Cupertino, CA (US)

(72) Inventors: Tyler S. Bushnell, Mountain View, CA (US); Jason C. Sauers, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 43 days.

(21) Appl. No.: 14/295,051

(22) Filed: Jun. 3, 2014

(65) Prior Publication Data

US 2015/0346782 A1    Dec. 3, 2015

(51) Int. Cl.
*H01R 4/72* (2006.01)
*G06F 1/18* (2006.01)

(52) U.S. Cl.
CPC .............. *G06F 1/181* (2013.01); *G06F 1/183* (2013.01); *H01R 4/726* (2013.01); *Y10T 29/49119* (2015.01)

(58) Field of Classification Search
USPC ........................................................ 439/161
See application file for complete search history.

(56) References Cited

U.S. PATENT DOCUMENTS

| | | | | |
|---|---|---|---|---|
| 4,374,603 A * | 2/1983 | Fukunaga | H01R 12/81 | 439/248 |
| 5,668,565 A * | 9/1997 | Robinson | H01Q 1/085 | 333/34 |
| 6,062,095 A * | 5/2000 | Mulrooney | G01D 11/24 | 73/204.22 |
| 6,310,299 B1 * | 10/2001 | Kim | G02F 1/13452 | 174/256 |
| 6,893,271 B2 * | 5/2005 | Seith | H01R 23/70 | 439/79 |
| 6,932,648 B1 * | 8/2005 | Chiu | H01R 13/65802 | 439/492 |
| 6,974,339 B2 * | 12/2005 | Kuzmenka | H01R 12/856 | 439/161 |
| 7,080,989 B2 * | 7/2006 | Gates | G06F 1/183 | 257/719 |
| 7,086,885 B2 * | 8/2006 | Alacqua | E05B 47/0009 | 439/161 |
| 7,234,842 B2 * | 6/2007 | Frederico | F21V 14/06 | 362/277 |
| RE40,303 E * | 5/2008 | Alacqua | E05B 47/0009 | 310/307 |
| 7,476,039 B2 * | 1/2009 | Moore | G02B 6/4201 | 385/92 |
| 7,538,472 B2 * | 5/2009 | Browne | H02N 2/0095 | 310/311 |
| 7,766,502 B2 * | 8/2010 | Tress | A47B 97/00 | 362/125 |
| 7,775,840 B2 * | 8/2010 | Matsumoto | H01R 13/113 | 439/843 |

(Continued)

FOREIGN PATENT DOCUMENTS

WO    9612588 A1    5/1996

*Primary Examiner* — Xanthia C Cunningham
(74) *Attorney, Agent, or Firm* — Treyz Law Group, P.C.; G. Victor Treyz; Joseph F. Guihan

(57) ABSTRACT

An electronic device has structures that are assembled using attachment structures. The attachment structures change shape to help join the electronic device structures together. Structures that may be joined together can include electronic device housing structures, display structures, internal device components, electrical components, and other portions of an electronic device. The attachment structures can include heat-activated attachment structures, structures that are activated using other types of applied energy, and structures that change shape due the application of chemicals or other treatments.

15 Claims, 23 Drawing Sheets

(56) References Cited

U.S. PATENT DOCUMENTS

| | | | |
|---|---|---|---|
| 7,891,572 B1* | 2/2011 | Murray | F22B 37/46 236/21 B |
| 8,250,725 B2 | 8/2012 | Sigler et al. | |
| 8,303,337 B2* | 11/2012 | Ballard | B60R 16/0207 174/113 R |
| 8,616,613 B2 | 12/2013 | Browne et al. | |
| 2002/0013103 A1* | 1/2002 | Kamei | B29C 61/0625 439/730 |
| 2003/0173863 A1* | 9/2003 | Butera | E05B 47/0009 310/307 |
| 2004/0192082 A1* | 9/2004 | Wagner | H05K 1/0283 439/67 |
| 2005/0198907 A1* | 9/2005 | McKnight | B60J 10/0002 49/475.1 |
| 2006/0050493 A1* | 3/2006 | Hamasaki | G02B 6/4201 361/767 |
| 2008/0019078 A1* | 1/2008 | Arimitsu | H01L 21/6835 361/321.2 |
| 2010/0154181 A1 | 6/2010 | Flanigan et al. | |
| 2012/0234000 A1* | 9/2012 | Browne | F03G 7/065 60/527 |
| 2013/0107425 A1 | 5/2013 | Wright et al. | |
| 2013/0335879 A1* | 12/2013 | Arimitsu | C09J 7/0207 361/301.4 |
| 2014/0017025 A1 | 1/2014 | Hemingway et al. | |
| 2015/0229111 A1* | 8/2015 | Kutalek | H02G 3/24 174/166 S |

* cited by examiner

ELECTRONIC DEVICE STRUCTURES JOINED USING SHRINKING AND EXPANDING ATTACHMENT STRUCTURES

BACKGROUND

This relates generally to electronic devices and, more particularly, to assembling structures to form electronic devices.

Electronic devices include housing structures and internal components. Fasteners can be used to attach parts of an electronic device together. In some applications, space is critical, so it can be helpful to use thin layers of adhesive to join device structures. Adhesives may be challenging to dispense and control and may have a tendency to push apart joined structures over time. These issues can be addressed by increasing manufacturing tolerances, but increasing tolerances can result in bulky and cumbersome designs.

It would therefore be desirable to be able to provide improved techniques for assembling structures for electronic devices.

SUMMARY

An electronic device has structures that are assembled using attachment structures. The attachment structures change shape to help join electronic device structures together. The attachment structures may be formed from polymers, foam, gel, shape memory metal, adhesive, other materials, and combinations of these materials. The attachment structures may expand or shrink during device assembly operations.

The device structures that are joined together can include electronic device housing structures, display structures, internal device components, electrical components, mechanical components, and other structures for an electronic device. For example, an expanding attachment structure or a contracting attachment structure may be used to bring a surface of a first electronic device structure into alignment with a surface of a second electronic device structure. Stop structures may be used to arrest motion of the structures being joined with respect to each other, thereby ensuring proper alignment between surfaces of the joined structures.

The attachment structures can include heat-activated attachment structure, structures that are activated using other types of applied energy, and structures that change shape due the application of chemicals or other treatments.

DETAILED DESCRIPTION

Electronic devices may be provided with structures that are joined using attachment structures based on material that shrinks and material that expands. The attachment structures that are used in joining the electronic device structures may be based on material such as a polymer (e.g., adhesive, foam, gel, etc.), may include a metal (e.g., shape memory metal), may include other substances, or may be formed from multiple materials.

The electronic device structures that are being joined may be display structures, camera structures, antenna structures, housing structures, internal structures, electrical components, substrates, brackets, housing walls, glass layers or other glass structures, transparent crystalline structures such as sapphire structures, carbon-fiber composite structures and other fiber composites, structures formed from other materials, and combinations of these structures.

Illustrative electronic devices that have structures that are joined using expandable and/or shrinkable material are shown in FIGS. 1, 2, 3, and 4.

Figure 1:
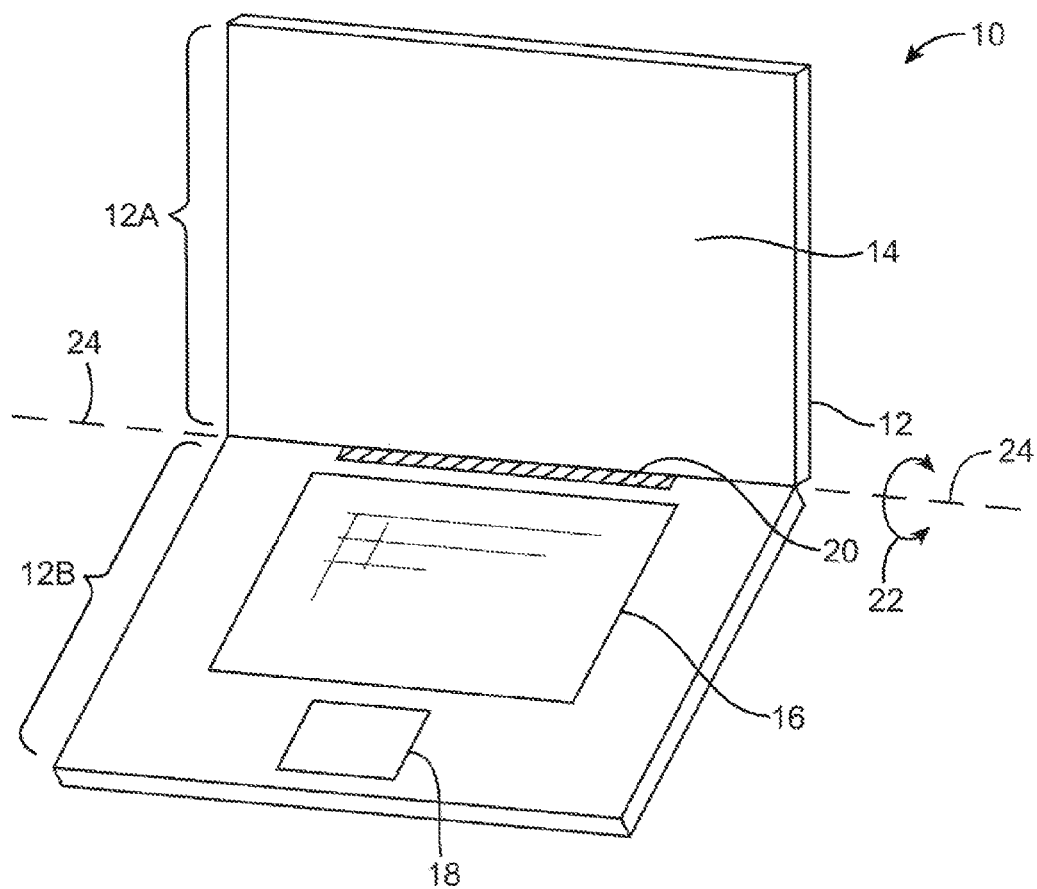
FIG. 1 is a perspective view of an illustrative electronic device such as a laptop computer in accordance with an embodiment.

Electronic device 10 of FIG. 1 has the shape of a laptop computer (portable computer) and has a portable computer housing 12 formed from upper housing 12A and lower housing 12B with components such as keyboard 16 and touchpad 18. Device 10 has hinge structures 20 (sometimes referred to as a clutch barrel) to allow upper housing 12A to rotate in directions 22 about rotational axis 24 relative to lower housing 12B. Display 14 is mounted in housing 12A. Upper housing 12A, which may sometimes be referred to as a display housing or lid, is placed in a closed position by rotating upper housing 12A towards lower housing 12B about rotational axis 24.

Figure 2:
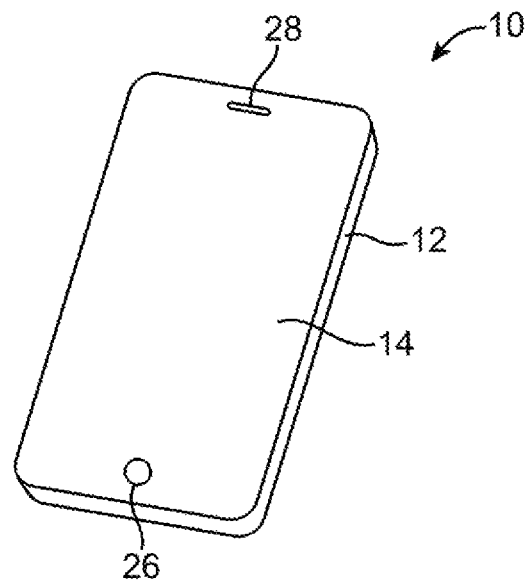
FIG. 2 is a perspective view of an illustrative electronic device such as a handheld electronic device in accordance with an embodiment.

FIG. 2 shows an illustrative configuration for electronic device 10 based on a handheld device such as a cellular telephone, music player, gaming device, navigation unit, or other compact device. In this type of configuration for device 10, device 10 (e.g., a cellular telephone) has opposing front and rear sides. Display 14 is mounted on a front face of device 10. Housing 12 may have a planar surface on the opposing rear face of device 10. Display 14 may have an exterior layer that includes openings for components such as button 26 and speaker port 28.

Figure 3:
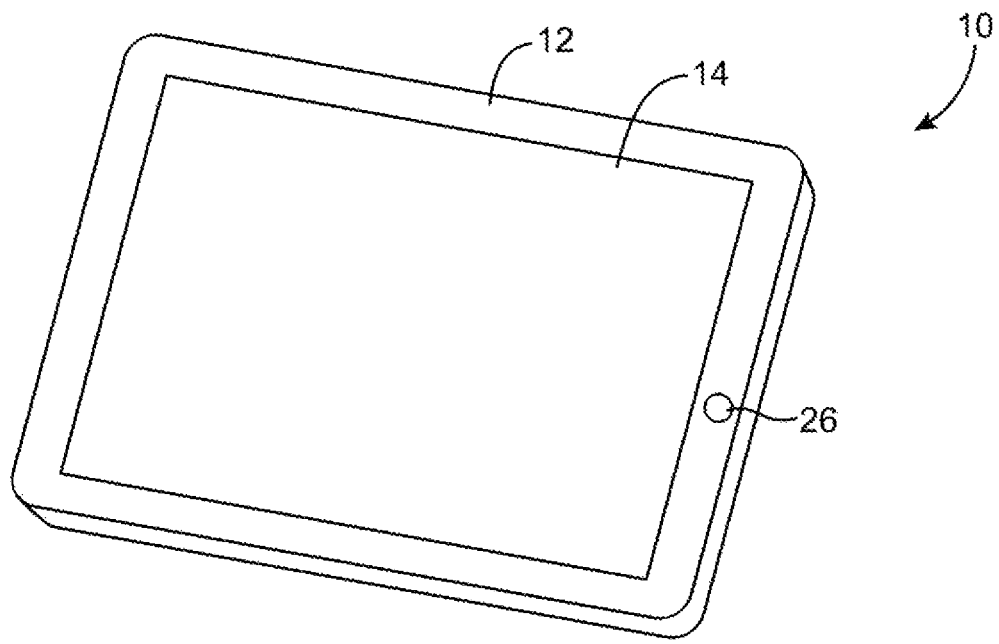
FIG. 3 is a perspective view of an illustrative electronic device such as a tablet computer in accordance with an embodiment.

In the example of FIG. 3, electronic device 10 is a tablet computer. In electronic device 10 of FIG. 3, tablet computer 10 has opposing planar front and rear surfaces. Display 14 is mounted on the front surface of device 10. Housing 12 may have a planar rear wall on the opposing rear surface of device 10. As shown in FIG. 3, display 14 has an external layer with an opening to accommodate button 26.

Figure 4:
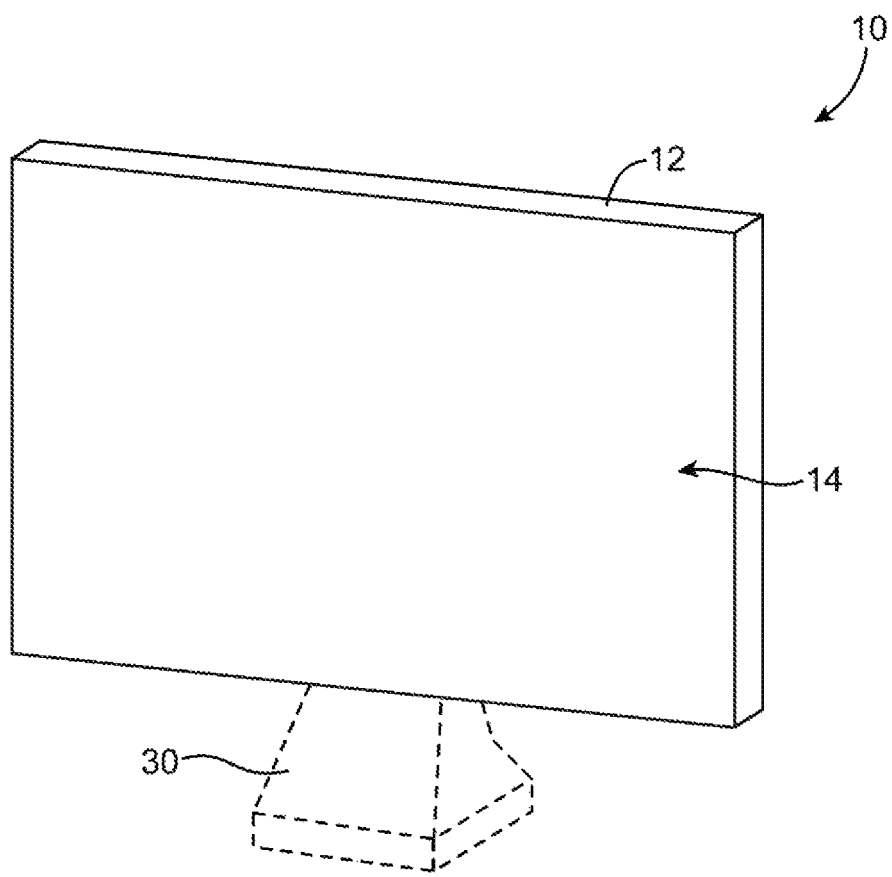
FIG. 4 is a perspective view of an illustrative electronic device such as a display for a computer or television in accordance with an embodiment.

FIG. 4 shows an illustrative configuration for electronic device 10 in which device 10 is a computer display, a computer that has an integrated computer display, or a television. Display 14 is mounted on a front face of device 10. With this type of arrangement, housing 12 for device 10 may be mounted on a wall or may have an optional structure such as support stand 30 to support device 10 on a flat surface such as a tabletop or desk.

Figure 5:
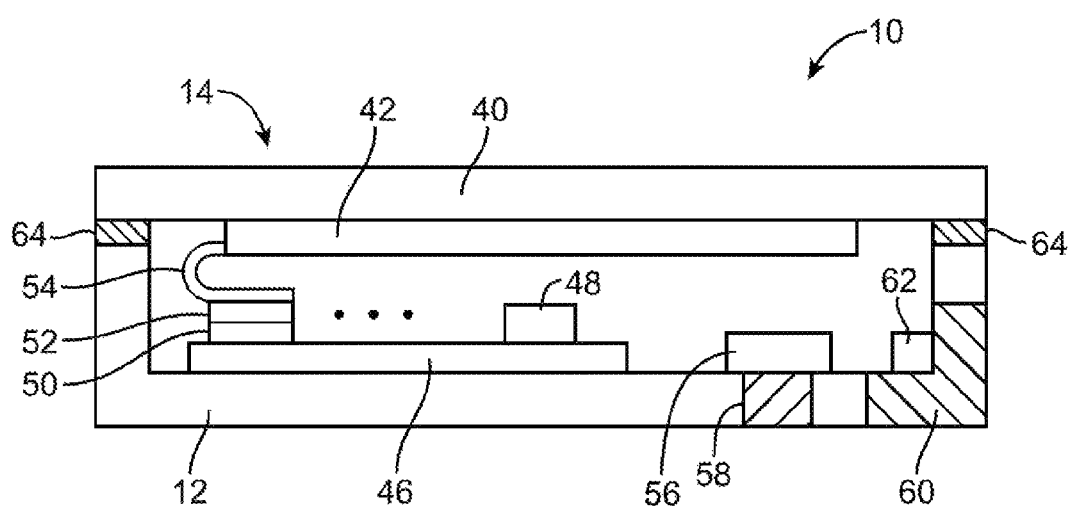
FIG. 5 is a cross-sectional side view of an illustrative electronic device in accordance with an embodiment.

A cross-sectional side view of an illustrative electronic device is shown in FIG. 5. As shown in FIG. 5, display 14 of device 10 may be formed from a display module such as display module 42 mounted under a cover layer such as display cover layer 40 (as an example). Display 14 (display module 42) may be a liquid crystal display, an organic light-emitting diode display, a plasma display, an electrophoretic display, a display that is insensitive to touch, a touch sensitive display that incorporates and array of capacitive touch sensor electrodes or other touch sensor structures, or may be any other type of suitable display. Display cover layer 40 may be layer of clear glass, a transparent plastic member, a transparent crystalline member such as a sapphire layer, or other clear structure.

Device 10 may have inner housing structures that provide additional structural support to device 10 and/or that serve as mounting platforms for printed circuits and other structures. Structural internal housing members may sometimes be referred to as housing structures and may be considered to form part of housing 12.

Electrical components 48 may be mounted within the interior of housing 12. Components 48 may be mounted to printed circuits such as printed circuit 46. Printed circuit 46 may be a rigid printed circuit board (e.g., a printed circuit board formed from fiberglass-filled epoxy or other rigid printed circuit board material) or may be a flexible printed circuit (e.g., printed circuit formed from a sheet of polyimide or other flexible polymer layer). Patterned metal traces within printed circuit board 46 may be used to form signal paths between components 48. If desired, components such as connectors may be mounted to printed circuit 46. As shown in FIG. 5, for example, a cable such as flexible printed circuit cable 54 may couple display module 42 to connector 52. Connector 52 may mate with corresponding connector 50. Connectors 52 and 50 may be bored-to-board connectors. Connector 52 may be soldered to flexible printed circuit 54. Connector 50 may be soldered to printed circuit 46. When coupled as shown in FIG. 5, signals may pass from signal lines in flexible printed circuit 54 (e.g., display signals associated with operation of display 42) and signal lines in printed circuit 46.

Housing 12 may have windows such as antenna window 60. Housing 12 may, for example, be formed from a conductive material such as metal. Antenna window 60 may be formed from a dielectric material such as plastic that is mounted within an opening in the metal. Antenna 62 may be mounted in a position that overlaps antenna window 60 (i.e., antenna 62 may be mounted in alignment with antenna window 60), so that radio-frequency signals transmitted by antenna 62 pass through antenna window 60 and so that radio-frequency signals that enter the interior of device 10 through antenna window 60 can be received by antenna 62.

A camera or other component 56 (e.g. an optical component or other light-based component) may be mounted in alignment with components such as transparent member 58. Transparent member 58 may be a glass disk (e.g., a camera window), may be a camera lens that has convex and/or concave surfaces, or may be other clear structure. Other openings may be formed in housing 12 if desired. The use of a camera window and antenna window in device housing 12 is merely illustrative.

Materials that expand and/or materials that contract such as polymers, shape memory metals, and other materials may be used in forming expanding and shrinking attachment structures (e.g., heat-activated attachment structures or structures that are activated using other sources of applied energy, chemical treatment, or other treatment). These attachment structures may be used in assembling device 10. As an example, material 64 may be used to attach display cover layer 40 of display 14 to housing 12 or may be used in joining other electronic device structures.

Figure 6:
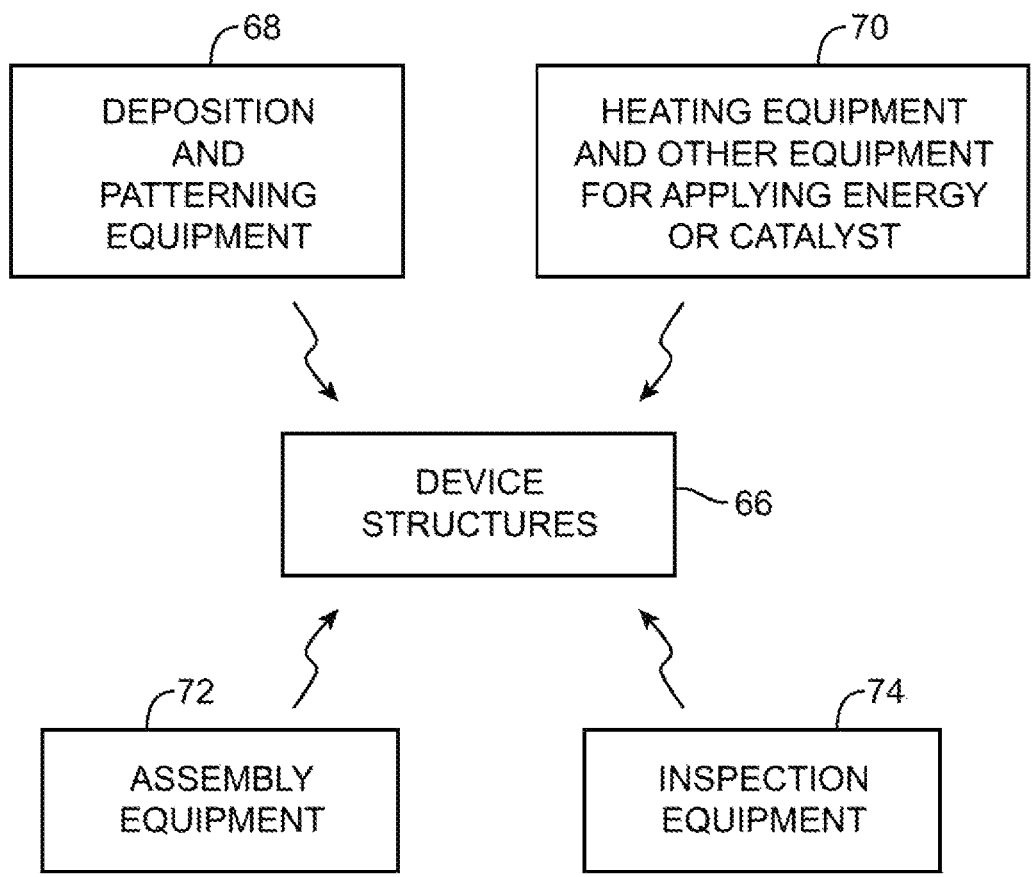
FIG. 6 is a diagram of illustrative equipment that may be used in assembling structures for an electronic device in accordance with an embodiment.

FIG. 6 is a diagram of illustrative equipment that may be used in assembling device structures 66 to form electronic device 10. Material such as material that can expand or contract upon application of heat or other energy may be deposited on device structures to be joined using deposition and patterning equipment 68. Equipment 68 may include printing equipment such as screen printing equipment, ink-jet printing equipment, pad printing equipment, and other printing equipment. Equipment 68 may also include nozzles and other dispensers for spraying, dripping, or otherwise coating parts of device structures 66 with the material used in joining structures 66. In some situations, pre-cut strips of tape or other structures may be formed separately from device structures 66 and then attached to device structures 66 prior to final assembly. If desired, blanket coatings may be applied to a structure and the blanket coating (or a local coating) may be patterned using etching equipment, photolithographic equipment, other photo-imaging equipment, lasers, machining equipment, or other material patterning tools.

The system of FIG. 6 may include equipment 70 such as heating equipment or other equipment for applying energy and/or catalyst to materials deposited on device structures 66. As an example, equipment 70 may include a heat gun, an infrared heat lamp, an oven, a laser, or other equipment for applying heat. Heat may be applied to device structures 66 globally or may be applied to localized portions of device structures 66. When the shrinkable or expandable material on structures 66 is exposed to the heat, the material shrinks or expands and thereby helps attach structures 66 together. The application of heat may be stopped when the attachment structures being used to join device structures 66 have successfully aligned respective surfaces in structures 66 or have otherwise moved structures 66 into desired positions.

In addition to applying heat with equipment 70 or as an alternative to applying heat, other types of energy can be supplied to the materials that are to be used to join the device structures (e.g., light, electrical signals such as current, etc.). Catalyst (e.g., water or other liquids, liquid solvent, gaseous catalyst, or other materials) may also be applied to the material that is being used to join device structures 66 to cause a chemical reaction to occur (e.g., to catalyze a reaction) or to otherwise change the size of the material being used to attach device structures together.

Assembly equipment 72 may include computer-controlled positioners, grippers, control circuitry to control the computer-controlled positions, manually controlled equipment, and other equipment for assembling device structures 66.

Inspection equipment 74 may include image sensors (e.g., a camera in a machine vision tool), light sensors, capacitive position sensors, mechanical sensors such as switches, strain gauges, and pressure sensors, electrical sensors such as a voltmeter or current meter, light-based visual inspection equipment, and other equipment for measuring the positions of the structural components of device 10.

To attach device structures together, a polymer foam or other material may be heated or otherwise treated using treatment equipment 70 of FIG. 6. The treatment with equipment 70 causes some or all of the polymer foam or other material to expand and/or to shrink (contract). Because the material that shrinks or expands may be used in attaching device structures 66 together, this material may sometimes be referred to as bonding material or attachment material. Fasteners, tape, and other structures may be formed from the attachment material. The structures that are formed from the attachment material may sometimes be referred to as attachment structures (e.g., heat-activated attachment structures, etc.).

Figure 7:
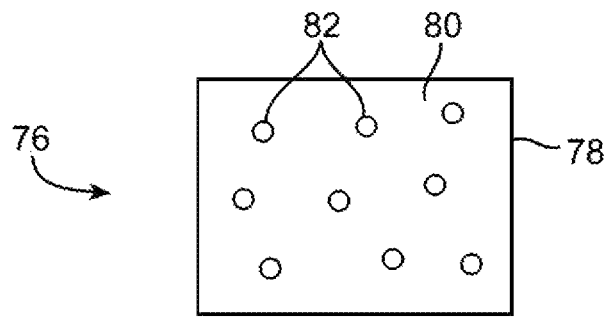
FIG. 7 is a cross-sectional side view of an illustrative foam material that may be used in assembling device structures in accordance with an embodiment.

An illustrative attachment structure of the type that may be used in coupling device structures 66 together when assembling device 10 is shown in FIG. 7. As shown in FIG. 7, attachment structure 76 may be formed from a material such as foam 78. Foam 78 may include solid material 80 (e.g., polymer) and voids 82 (e.g., fluid-filled bubbles such as gas-filled bubbles or liquid-filled bubbles). Voids 82 may include microspheres such as hollow glass microspheres, low-density polymer beads, or other structures.

Figure 8:
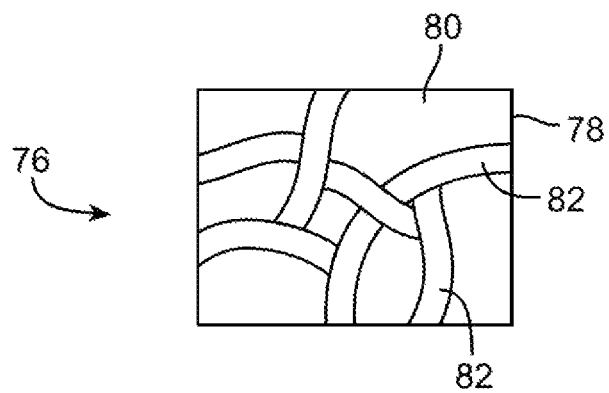
FIG. 8 is a cross-sectional side view of an illustrative material with interconnected pores that may be used in assembling device structures in accordance with an embodiment.

Another illustrative attachment structure with voids is shown in FIG. 8. As shown in FIG. 8, attachment structure 76 may have solid material 80 (e.g., polymer) and pores 82 that form a foam. Pores 82 may be filled with fluid such as a liquid or gas. If desired, some of pores 82 may be filled with material and some of pores 82 may be filled with air. The presence of air-filled pores may help liquid evaporate from liquid-filled pores (e.g., pores filled with liquid adhesive, solvent, or other materials). Foams such as foam 78 of FIG. 7 are sometimes referred to as closed-cell foams, whereas foams such as foam 78 of FIG. 8 may sometimes be referred to as open-cell foams. Polymer 80 of structures 76 in FIGS. 7 and 8 may be formed from an elastomeric material.

Figure 9:
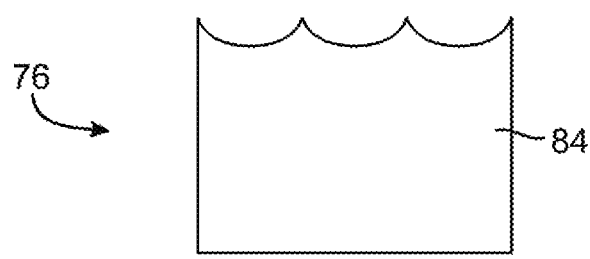
FIG. 9 is a cross-sectional side view of a gel that may be used in assembling device structures in accordance with an embodiment.

Attachment structure 76 of FIG. 9 has been formed from a gel material. Gel 84 may be a polymer that is sufficiently viscous to resist wicking and running (i.e., gel 84 may be thicker than liquid polymers such as liquid adhesives). If desired, attachment structures can be formed from liquids that expand or contract upon application of catalyst, heat, or other energy.

Figure 10:
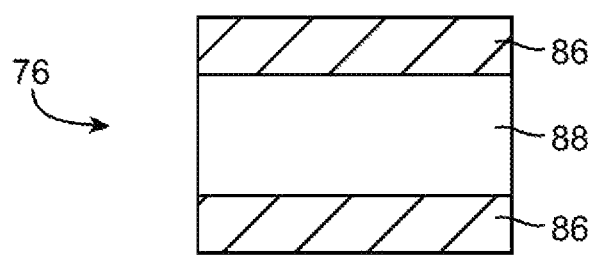
FIG. 10 is a cross-sectional side view of a tape or other structure with upper and lower tacky portions and a central portion that may be used in assembling device structures in accordance with an embodiment.

Illustrative attachment structure 76 of FIG. 10 has been formed from upper layer 86 and opposing lower layer 86 on material 88. Material 88 may be, for example, a solid polymer and layers 86 may be layers of pressure sensitive adhesive. If desired, layers 86 may be formed by chemically tackifying the upper and lower surfaces of material 88.

Figure 11:
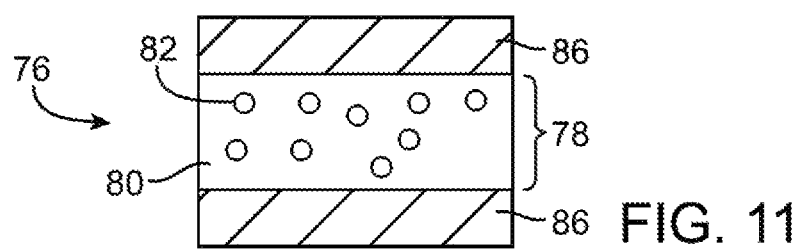
FIG. 11 is a cross-sectional side view of a material such as foam that has been provided with upper and lower adhesive layers for assembling device structures in accordance with an embodiment.

FIG. 11 is a cross-sectional side view of an illustrative configuration for attachment structure 76 with upper and lower adhesive layer 86 on foam 78. Foam 78 may include solid material 80 (e.g., polymer) and voids 82. If desired, foam 78 may include pores 82 (FIG. 8) or may be formed from a mixture of open-cell and closed-cell foams. Solid polymer regions and/or other structures may also be incorporated into attachment structures 76 of FIG. 11 if desired.

Figure 12:
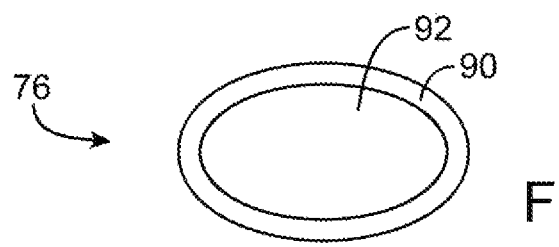
FIG. 12 is a cross-sectional side view of a balloon that may be used in assembling device structures in accordance with an embodiment.

FIG. 12 is cross-sectional side view of an illustrative arrangement for attachment structure 76 that is based on a hollow balloon. As shown in FIG. 12, balloon membrane 90 may surround a hollow inner cavity such as cavity 92. Membrane 90 may have the shape of a sphere or other shape that forms a resilient balloon structure. A thin elastomeric substance may be used in forming membrane 90 to allow membrane 90 to expand and contract (e.g., upon heating and cooling). Cavity 92 may be filled with fluid (e.g., a gas such as air, etc.).

Figure 13:
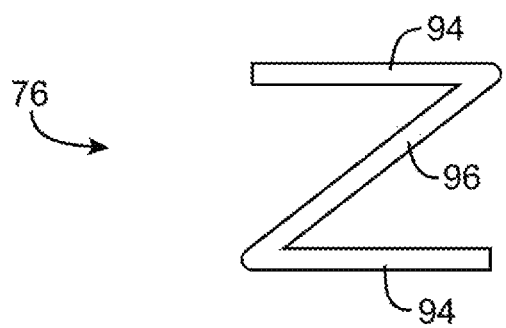
FIG. 13 is a cross-sectional side view of a structure formed from a shape memory metal or other structure that expands or contracts for use in assembling device structures in accordance with an embodiment.
Figure 14:
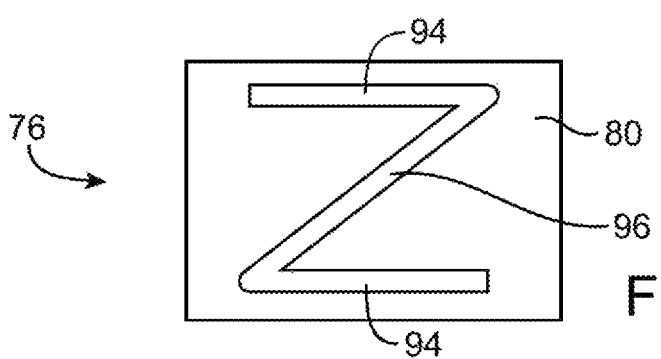
FIG. 14 is a cross-sectional side view of the structure of FIG. 13 embedded within a polymer or other material for use in assembling device structures in accordance with an embodiment.

If desired, attachment structures can be formed from clips, springs, brackets, or other structures that expand and shrink when attaching device structures 66 to each other. FIG. 13 is a cross-sectional side view of an illustrative Z-shaped clip having parallel upper and lower horizontal members 94 coupled by a diagonal central member 96. Clips such as clip 76 of FIG. 13 may have two or more zig-zags, may have curved shapes (e.g., S-shapes with one or more curves), may be formed in the shape of a helix, or may have other shapes that allow the clips to expand and shrink when attaching structures 66 together. As shown in FIG. 14, attachment structure 76 may have structures such as the clip structure of FIG. 13 that are embedded within one or more other materials such as illustrative polymer material 80. Attachment structure 76 of FIG. 13 and the corresponding inner portion of attachment structure 76 of FIG. 14 may be formed from metal (e.g., a shape memory metal such as nickel-chromium), may be formed from a polymer, or may be formed from other materials.

All or part of the attachment structures of FIGS. 7, 8, 9, 10, 11, 12, 13, and 14 and/or other attachment structures may be combined with each other to form hybrid attachment structures. For example, foam may be combined with a clip structure of the type shown in FIG. 13, a balloon-type structure of the type shown in FIG. 12 may be combined with a gel or foam, adhesive coatings may be provided on one or more surfaces to help attach the attachment structure to the device structures being joined, etc. The examples of FIGS. 7, 8, 9, 10, 11, 12, 13, and 14 are merely illustrative.

Attachment structures 76 may expand upon application of catalyst, heat, or other energy, or may contract upon application of catalyst, heat, or other energy. Global changes may be imparted in globally applied attachment structures and/or local changes may be made in the attachment structures. As an example, an attachment structure on one portion of a part may be expanded (or contracted) by a first amount and an attachment structure on another portion of the part may be expanded (or contracted) by a second amount that is different than the first amount.

Figure 15:
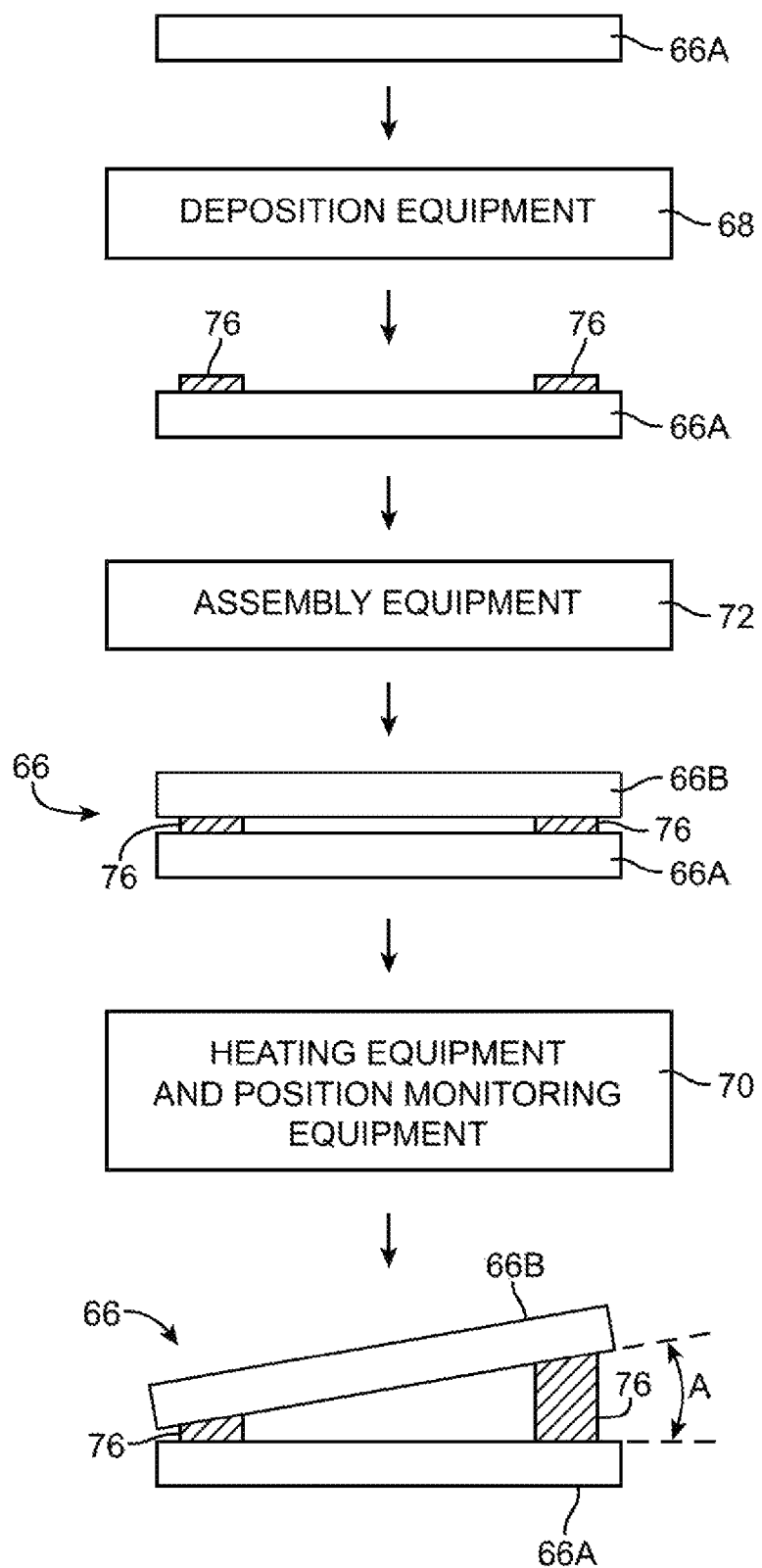
FIG. 15 is a diagram of illustrative equipment and operations involved in assembling device structures in accordance with an embodiment.

FIG. 15 shows illustrative equipment and processing operations of the type that may be used in assembling device structures. As shown in FIG. 15, deposition equipment 68 (see, e.g., equipment 68 of FIG. 6) may be used to deposit and pattern attachment structures 76 on device structure 66A. Assembly equipment 72 may then be used to place another device structure such as device structures 66B in contact with attachment structures 76 (i.e., assembly equipment 72 may sandwich attachment structures 76 between respective device structures such as structures 66A and 66B). Other types of structures may be assembled using one or more attachment structures such as attachment structures 76 of FIG. 15. The use of a pair of attachment structures located on the left and right sides of the device structures is merely illustrative.

Structures 66A and 66B may be housing structures, internal device structures, electrical components, connectors, mounting brackets, input-output devices, display layers in display 14 such as display cover layer 40 and/or display module 42, or other device structures. Attachment structures may be formed from structures of the type described in connection with FIGS. 7, 8, 9, 10, 11, 12, 13, and 14 or other suitable structures. Attachment structures 76 may, as an example, be shrinkable structures that shrink when exposed to catalyst, heat, or other energy (e.g., heat-activated attachment structures).

It may be desirable to control the orientation of device structures 66B and 66A with respect to each other. This may be done by selectively expanding attachment structures 76 on the left and right sides of structures 66. Using position monitoring equipment, the position of device structure 66B relative to device structures 66A may be monitored in real time. While monitoring the positions of structures 66 (e.g., while monitoring the position of structure 66B relative to structure 66A), localized heating equipment or equipment for applying other localized energy or catalyst may be used to control the application of heat or other energy or the application of catalyst to each attachment structure 76. If, for example, it is desired to raise the right side of structure 66B more than the left side of structures 66B so that structure 66B is oriented at a non-zero angle A, the attachment structure on the right side of structures 66 can be heated more (or otherwise treated more) than the attachment structure on the left side of structures 66. This may cause the right-hand attachment structure 76 to expand more than the left-hand attachment structure 76 so that structures 66B and 66A become oriented at a non-zero angle A with respect to each other.

Figure 16:
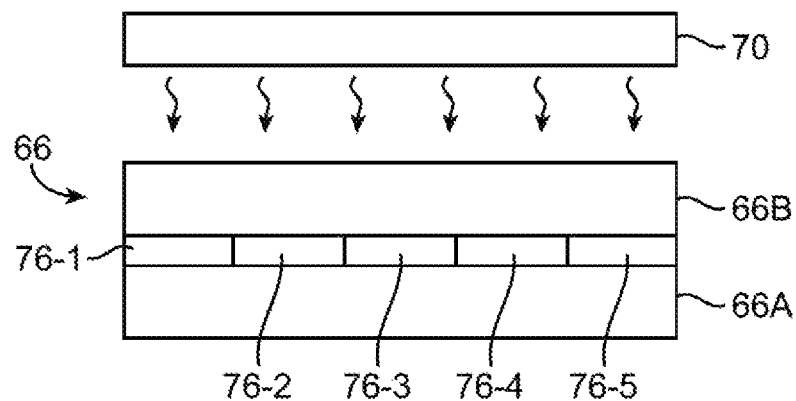
FIG. 16 is a cross-sectional side view of equipment that is heating a layer of material between upper and lower structures in a device.
Figure 17:
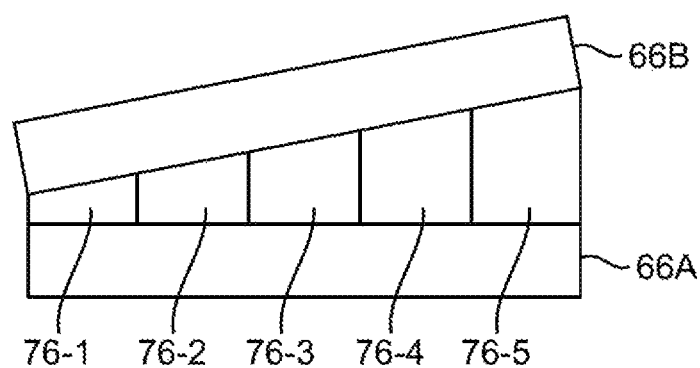
FIG. 17 is a cross-sectional side view of the structures of FIG. 16 following heating of the layer of material in accordance with an embodiment.

If desired, a non-uniform attachment structure expansion may be achieved by using attachment structures with locally varying expansion properties. This type of arrangement is shown in FIG. 16. In the FIG. 16 example, device structure 66B is being coupled to device structure 66A. A layer of material is interposed between structures 66A and 66B that serves as an attachment structure. As shown in FIG. 16, the attachment structure layer has regions such as regions 76-1, 76-2, 76-3, 76-4, and 76-5, each of which has a different chemical and/or mechanical makeup so that each region will expand by a different amount when exposed to even heat from heater 70. Following exposure to uniform blanket heat from heater 70 (or other blanket energy or treatment), structures 66 of FIG. 16 will appear as shown in FIG. 17. As shown in FIG. 17, each of the regions 76-1, 76-2, 76-3, 76-4, and 76-5 of the attachment structure will expand by a different respective amount (in this example). Combinations of the approach shown in FIGS. 16 and 17 (i.e., use of an attachment structure with different regions that change size differently when exposed to the same treatment) or and the approach of FIG. 15 (treating each of multiple attachment structures differently to cause different respective amounts of size change) may also be used.

Figure 18:
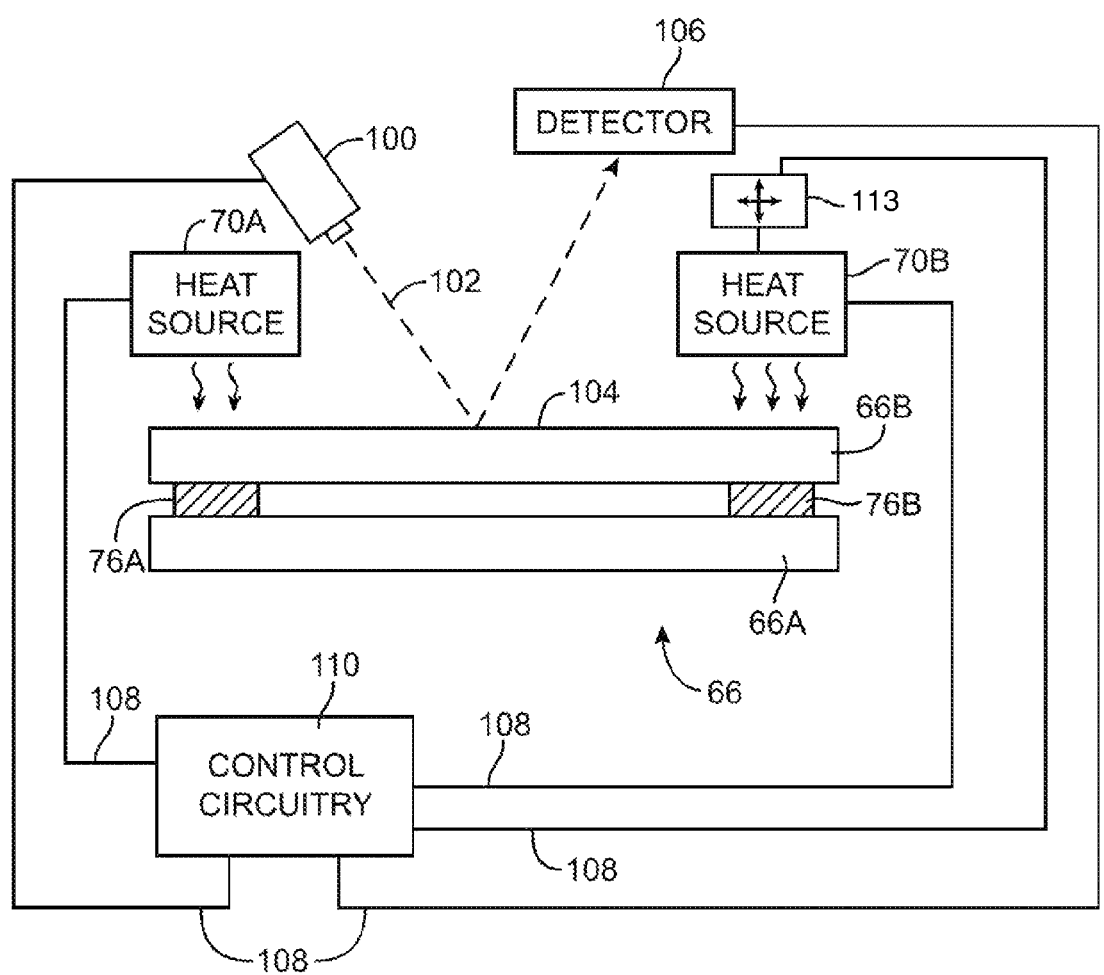
FIG. 18 is a diagram of equipment that may be used in heating a layer of material and equipment that may be used in monitoring how structures are being joined by the layer of material in accordance with an embodiment.

FIG. 18 shows illustrative equipment of the type that may be used in selectively treating different attachment structures 76 while monitoring the positions of device structures 66 during the process of attaching device structures 66 with attachment structures 76. As shown in FIG. 18, a light source such as light source 100 may emit a light beam such as light beam 102. Light source 100 may be a laser, a light-emitting diode, or other light source. Light beam 102 may be reflected from surface 104 of device structure 66B. Detector 106 may detect the position of reflected beam 102. Paths 108 may be used to allow control circuitry 110 to provide control signals to light source 100 that direct light source 100 to produce beam 102. Paths 108 may also be used to covey data from detector 106 to control circuitry 110. Control circuitry 110 may process information from detector 106 to determine the position of beam 102 and thereby determine the orientation of surface 104 and structure 66B relative to structure 66A. If desired, mechanical switches or other light-based position monitoring equipment may be used to gather information on the position of structures 66. The use of light source 100, light detector 106, and control circuitry 110 is merely illustrative. Computer-controlled positioning equipment such as illustrative positioner 113 may be controlled by control signals over path 108 and may be used to control the positions of the equipment of FIG. 18 and/or device structures 66 in connection with the assembly of structures 66.

Control circuitry 110 may use control signals conveyed on path 108 to control the application of heat by multiple localized sources such as illustrative heat source 70A and heat source 70B. The heat produced by sources 70A and 70B may be used in controlling how much structure 66B is tilted (angled) relative to structure 66A.

Heat source 70A may produce heat that heats attachment structure 76A. Heat source 70B may produce heat that heats attachment structure 76B. By controlling the relative amount of heat produced by localized heat sources 70A and 70B while monitoring the position of structure 66B in real time using equipment such as light source 100 and detector 106, control circuitry 110 can adjust the position of structure 66B relative to structure 66A. Consider, as an example, a scenario in which it is desired for structures 66A and 66B to be parallel to each other (i.e., both 66A and 66B are to be horizontal). If control circuitry 110 determines that structure 66B is tilted so that the left side of structure 66B is lower than the right side of structure 66B, control circuitry 110 can direct heat source 70A to apply more heat to attachment structure 76A than heat source 70B is applying to attachment structure 76B. The horizontal position of structure 66A may be maintained using fixtures in assembly equipment 72. Control circuitry 110 can monitor the orientation of structure 66B relative to structure 66A in real time. Once structure 76A has expanded sufficiently to place structure 66B in a desired horizontal orientation (or other desired tilt orientation), control circuitry 110 may halt the application of heat with heat sources 70A and 70B.

Figure 19:
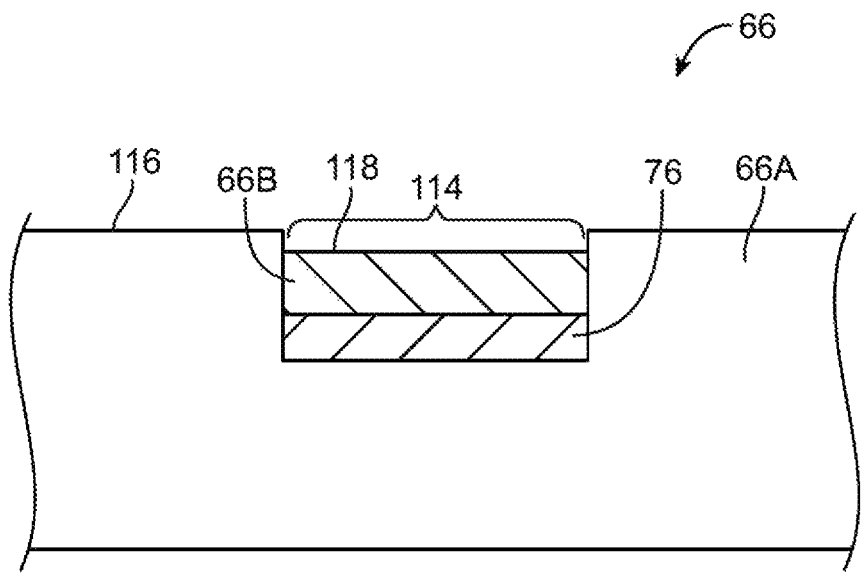
FIG. 19 is a cross-sectional side view of illustrative device structures being joined using an expandable attachment structure in accordance with an embodiment.
Figure 20:
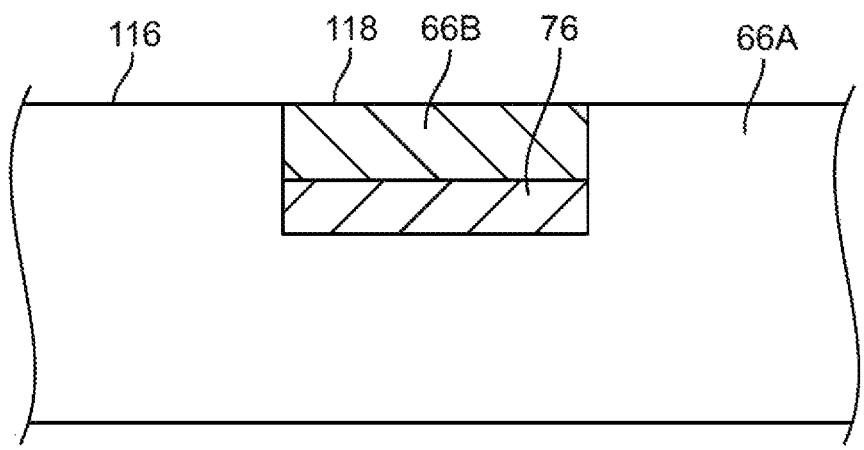
FIG. 20 is a cross-sectional side view of the device structures of FIG. 19 following expansion of the expandable attachment structure to bring one of the structures into alignment with another of the structures in accordance with an embodiment.

FIGS. 19 and 20 show how heat may be applied until a surface of one structure is flush with another structure or until another desired alignment has been achieved. As shown in FIG. 19, structure 66A may have a recess such as recess 114. Structure 66B may be placed within recess 114 so that surface 118 of structure 66B lies below surface 116 of structure 66A. Heat or other treatment may be applied to attachment structure 76. Structure 76 may expand in response to the applied heat. Position monitoring equipment (e.g., light-based equipment of the type shown in FIG. 18 or other equipment) may be used to monitor the relative positions of surfaces 118 and 116 in real time while attachment structure 76 is in the process of expanding due to the applied heat. When it is determined that surface 118 has been aligned with surface 116 (i.e., when surface 118 has become flush with surface 116), the application of heat to attachment structure 76 may be stopped. This causes attachment structure 76 to remain fixed in the position reached in FIG. 20.

Attachment structures 76 may hold structures 66A and 66B together. To help hold structures 66 together, attachment structures 76 may be formed form a polymer or other substance (e.g., an adhesive coating) that is tacky or that becomes tacky when treated (e.g., a polymer that becomes sticky when heated). Attachment structures 76 may also become engaged with engagement features on structures 66.

In some situations, structures 76 bias structure 66A and/or structure 66B towards each other. In other situations, an attachment structure 76 is attached to both structures 66A and 66B and holds structures 66A and 66B together through the attachment of these structures to the attachment structure. For example, attachment structure 76 may be affixed to structures 66A and/or 66B using an adhesive in structure 76 or by using a tacky surface of structure 76 that has been produced by applying heat, a tackifying chemical, or other tackifying treatment.

Figure 21:
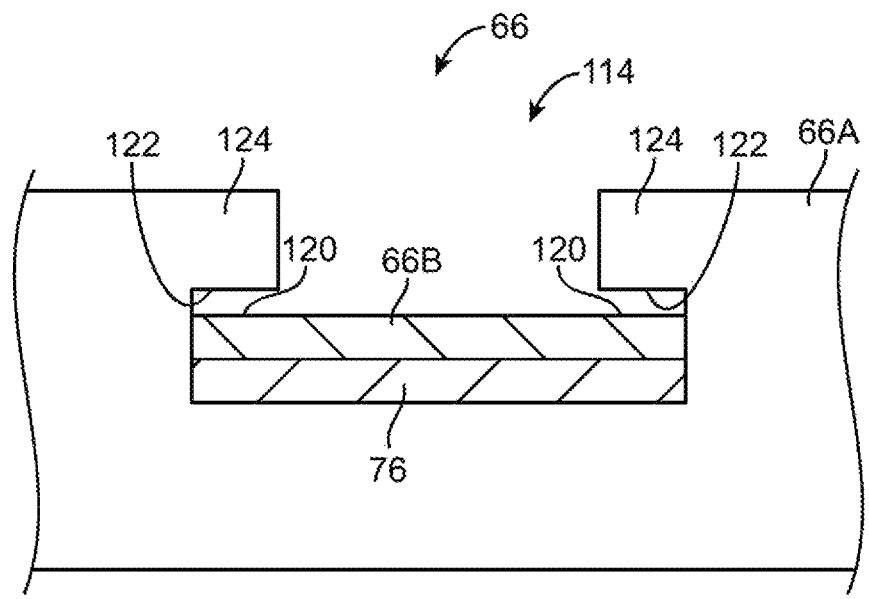
FIG. 21 is a cross-sectional side view of an illustrative device structure being mounted within another device structure using an expandable attachment structure in accordance with an embodiment.
Figure 22:
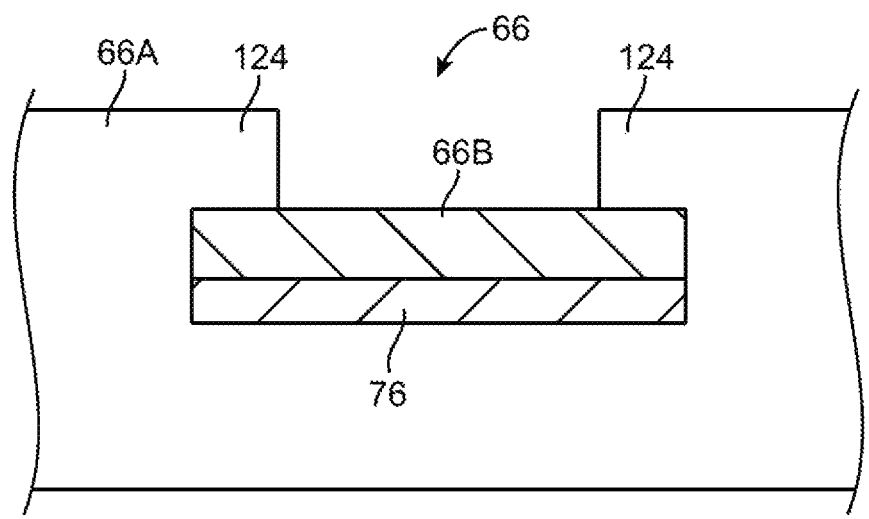
FIG. 22 is a cross-sectional side view of the illustrative device structures of FIG. 21 following expansion of the expandable attachment structure in accordance with an embodiment.

If desired, mechanical stop structures may be incorporated into device structures to help arrest the travel of a moving structure and thereby align surfaces in the structures or otherwise accurately define the relative positions between device structures that are being assembled. As an example, consider the illustrative device structures that are being assembled in FIGS. 21 and 22. As shown in FIG. 21, device structure 66A may have recess 114. Device structure 66B may be received within structure 66A. Attachment structure 76 may be expandable. In the configuration of FIG. 21, attachment structure 76 is in an unexpanded state and is interposed between structure 66B and 66A. Surface portions 120 of structure 66B are initially not in contact with opposing surfaces 122 of structure 66A.

Structure 66A may have portions such as portions 124 that extend over structure 66B. Portions 124 may serve as stop structures that arrest the upward movement of structure 66B at a defined position. As attachment structure 76 is heated, edge surfaces 120 of structure 66B will come into contact with opposing lower surfaces 122 of stop structures 124 in device structures 66A. This ensures that structure 66B will be aligned with respect to structure 66A and will be attached to structure 66A in a well-defined location, as shown in FIG.

22. Due to the use of mechanical stop structures in device structures 66, it is not necessary to monitor the positions of structures 66 in real time.

Figure 23:
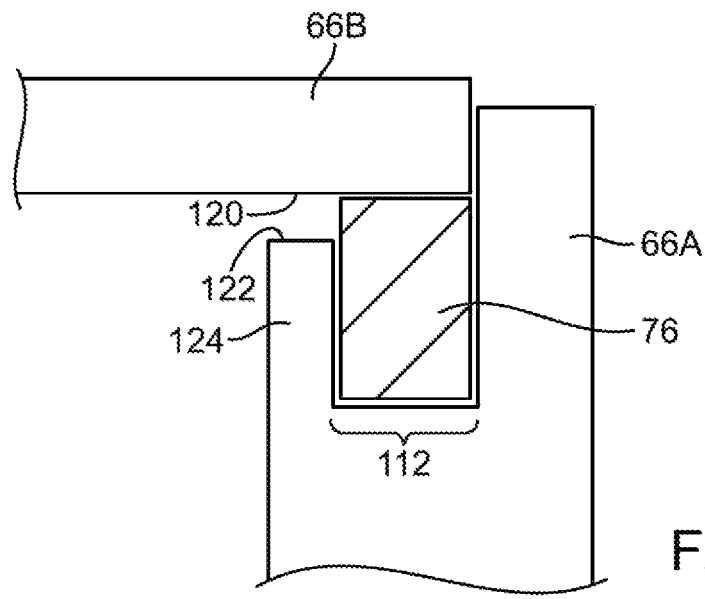
FIG. 23 is a cross-sectional side view of illustrative device structures being joined using an attachment structure based on a shrinkable material such as heat-activated shrinkable material in accordance with an embodiment.

Stop structures and real-time monitoring arrangements may be used independently or may be used together when joining device structures 66. In addition, attachment structures 76 that are based on either expandable structures or shrinkable structures may be used with stop structures and/or real-time monitoring. In the illustrative configuration of FIG. 23, device structure 66A (e.g., an electronic device housing wall or other structure) may have a recess such as recess 112 that receives a shrinkable attachment structure 76. Protrusion 124 forms a stop structure having a stop surface such as surface 122. Device structure 66B (e.g., a display cover layer such as layer 40 or other layer in display 14) may be attached to device structure 66A by heating attachment structure 76. Prior to heating structure 76, structure 76 is enlarged and surface 122 of stop structure 124 is separated from opposing surface 120 of structure 66B as shown in FIG. 23.

Figure 24:
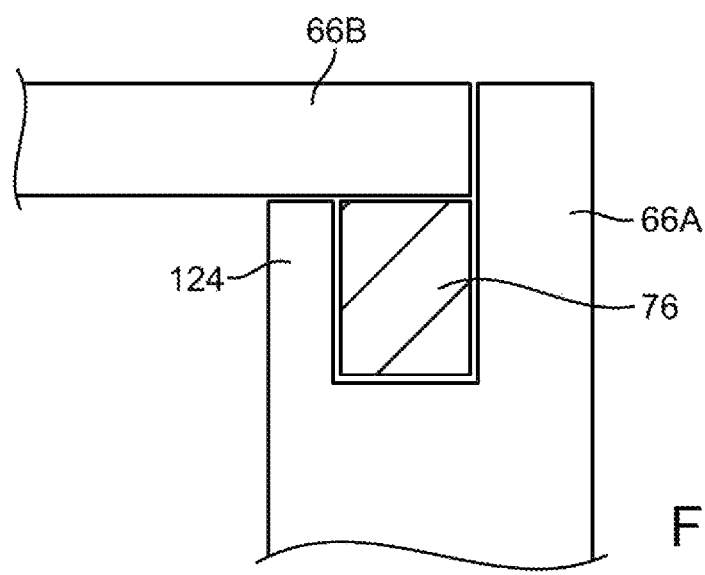
FIG. 24 is a cross-sectional side view of the illustrative device structures of FIG. 23 after shrinking the shrinkable structure in accordance with an embodiment.

When attachment structure 76 is heated, structure 76 shrinks (contracts). Attachment structure 76 is attached to structures 66A and 66B (e.g., due to the tacky surfaces of structure 76 such as adhesive layers 86, etc.). When attachment structure 76 contracts, structure 66B is pulled downwards towards stop 124 until structure 66B rests against structure 66A as shown in FIG. 24. The presence of stop 124 prevents additional movement of structure 66B with respect to structure 66A and ensures that structures 66B and 66A are aligned as desired. Attachment structure 76 can continue to pull structures 66B inwardly (down in the orientation of FIG. 24) after heat is no longer being applied to attachment structure 76, thereby helping to prevent disassembly of structures 66B and 66A.

Figure 25:
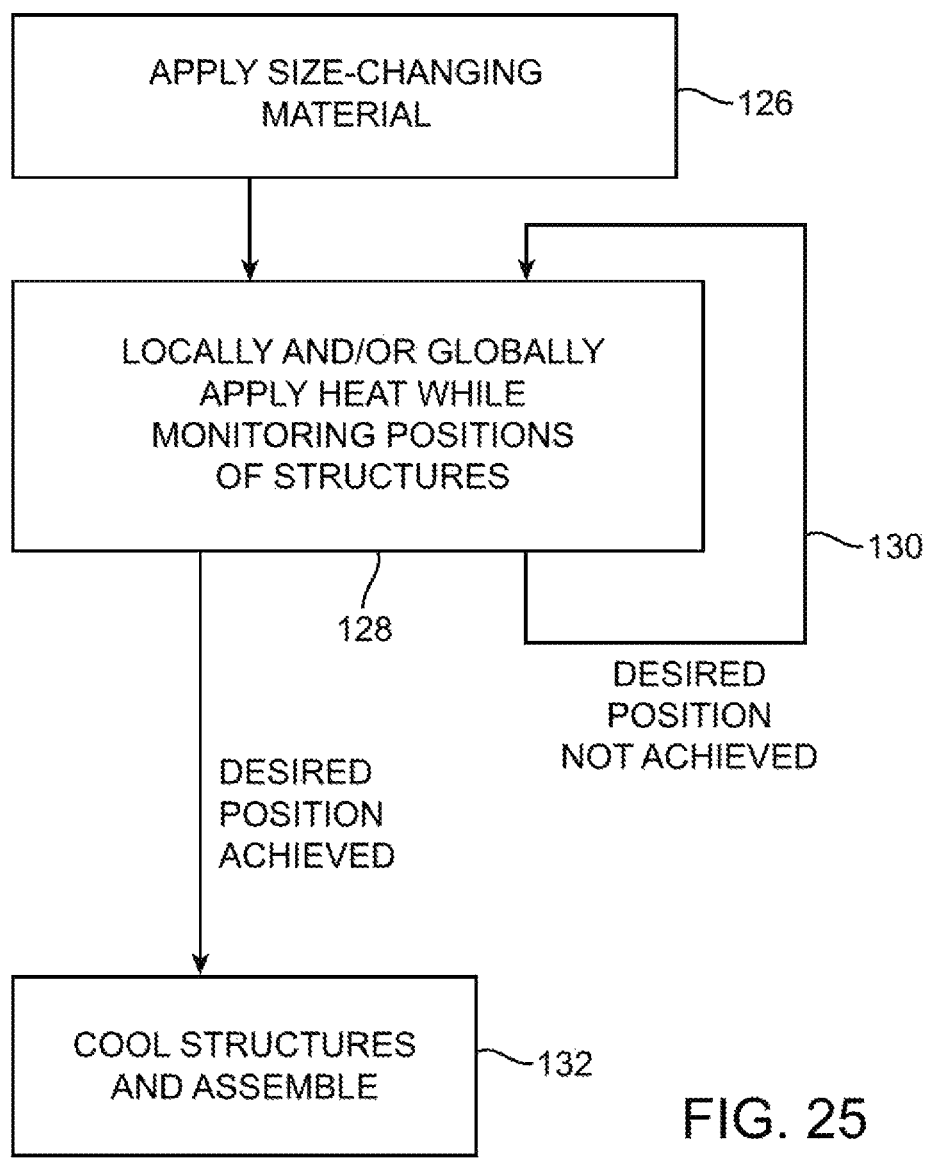
FIG. 25 is a flow chart of illustrative steps involved in using expandable or shrinkable material in assembling device structures in accordance with an embodiment.

A flow chart of illustrative steps involved in using size-changing attachment structures such as attachment structures 76 to assemble device structures 66 for device 10 is shown in FIG. 25.

At step 126, size changing material for attachment structures 76 is applied to device structures 66. The material(s) for size-changing attachment structures 76 may be applied using coating techniques, other deposition techniques, or other techniques. The size changing material may be a material that expands when treated or may be a material that contracts (shrinks) when treated. Attachment structures may be applied using equipment 68 of FIG. 6. Examples of attachment structures are described in connection with FIGS. 7, 8, 9, 10, 11, 12, 13, and 14.

At step 128, the size-changing material(s) of structures 76 may be treated using applied heat, other sources of applied energy, applied catalyst, or other applied treatments. Local and/or global treatments may be applied to attachment structures 76. If desired, attachment structures 76 may have different regions with different respective size-changing properties, as described in connection with FIG. 17. Device structure position monitoring equipment may be used to monitor the positions of device structures 66 in real time during the application of heat, other energy, catalyst, or other treatments to attachment structures 76. Stop structures may also be used to ensure accurate positions for device structures 66 are achieved (e.g., to ensure that surfaces in structures 66 are aligned with respect to each other). As illustrated by line 130, treatment(s) may be applied continuously until device structures 66 have reached their desired positions. Once the desired positions for device structures 66 have been achieved, the application of heat or other treatment to attachment structures 76 may be ceased (i.e., device structures 66 may be cooled), as shown by step 132.

Figure 26:
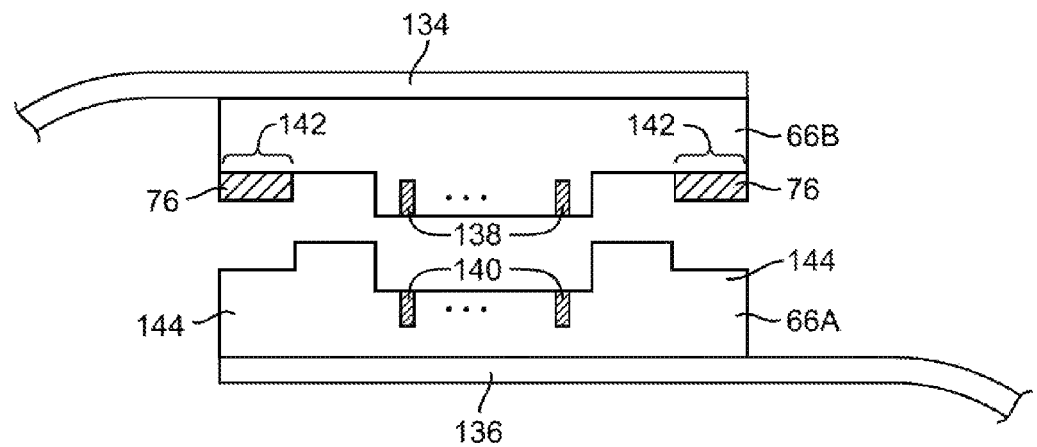
FIG. 26 is a cross-sectional side view of a pair of illustrative connectors of the type that may be joined using shrinkable material in accordance with an embodiment.
Figure 27:
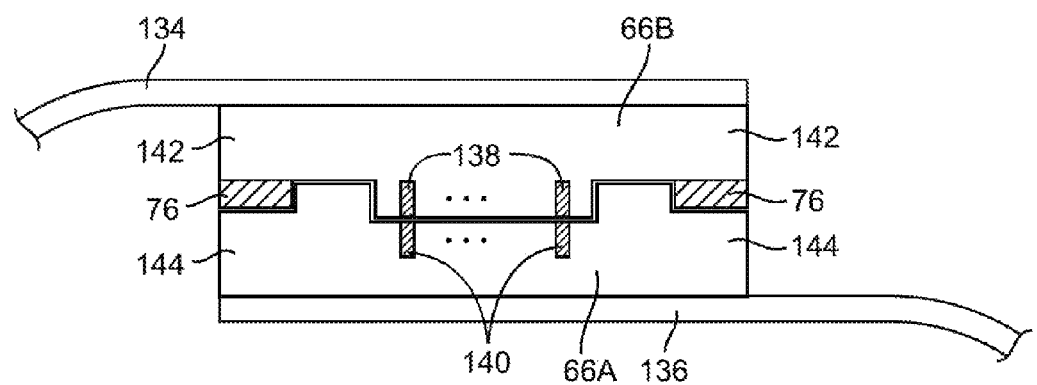
FIG. 27 is a cross-sectional side view of the connectors of FIG. 27 after the connectors have been mated and held together using an attachment structure formed from the shrinkable material of FIG. 26 in accordance with an embodiment.

If desired, connectors can be joined using attachment structures 76. For example, shrinking (contracting) attachment structures 76 may be used in joining device connectors. This type of arrangement is shown in FIGS. 26 and 27. As shown in FIG. 26, a connector such as connector 66A (e.g., a board-to-board connector) may be mounted to substrate 136. A mating connector such as connector 66B (e.g., a board-to-board connector) may be mounted to substrate 134. Substrates 134 and 136 may be rigid printed circuit boards, flexible printed circuits, or other substrates. Solder, conductive adhesive, or other conductive coupling mechanisms may be used to mount connectors 66A and 66B.

Connector 66A may have contacts such as metal pins 140. Connector 66B may have matching contacts such as metal pins 138. To ensure that connectors 66A and 66B are held together and that contacts 140 mate with contacts 138, attachment structures 76 can be applied to portions 142 of structures 66B (and/or may be applied to portions 144 of connector 66A). Connectors 66A and 66B may then be mated and heat or other treatment applied to attachment structures 76. The application of heat to attachment structures 76 causes attachment structures 76 to shrink in height. Attachment structures 76 are attached to portions 142 of connector 66B and portions 144 of connector 66A through adhesive layers 86 in structures 76, through tacky surfaces of structures 76, through engagement features in structures 76 that interlock with mating engagement features in connectors 66A and 66B, and using other attachment mechanisms. As attachment structures 76 contract due to application of heat or other treatment, connectors 66A and 66B are moved towards each other, thereby ensuring that connectors 66A and 66B will satisfactorily mate and ensuring that each of connectors 138 will be coupled to a corresponding one of connectors 140. During the lifetime of structures 66 in device 10, contracted attachment structures 76 will continue to pull connectors 66A and 66B towards each other, thereby helping to prevent connectors 66A and 66B from becoming disassembled. Because connectors 66A and 66B are being pulled toward each other, the size of connectors 66A and 66B can be minimized and ancillary structures such as holding clamps can be simplified or eliminated from device 10.

Figure 28:
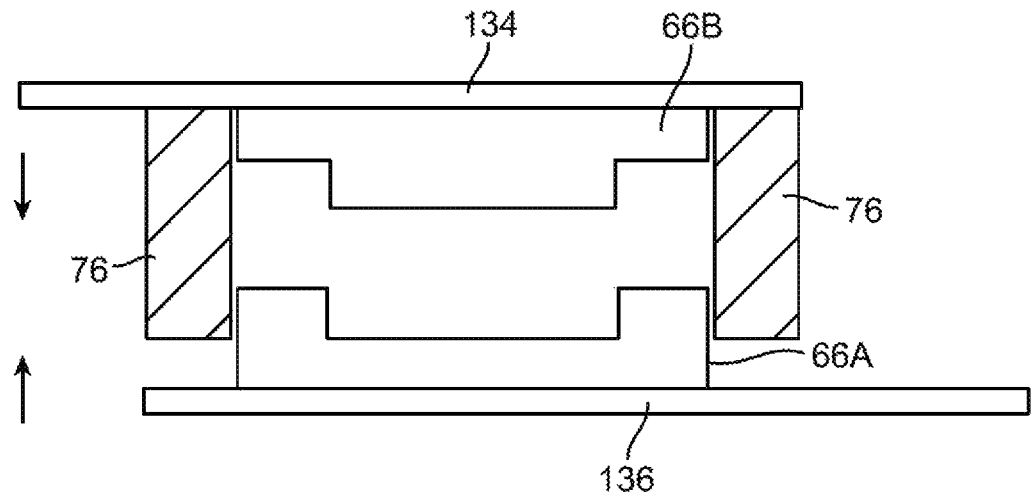
FIG. 28 is a cross-sectional side view of illustrative connectors being joined using shrinkable material that couples two substrates in accordance with an embodiment.
Figure 29:
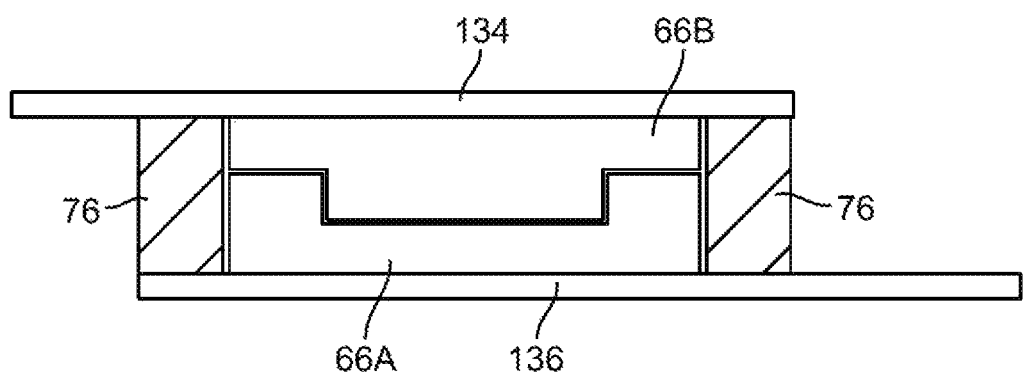
FIG. 29 is a cross-sectional side view of the connectors and substrates of FIG. 28 after the shrinkable material has been used to couple the connectors and substrate together in accordance with an embodiment.

FIG. 28 shows how attachment structures 76 may be attached to portions of printed circuits 134 and 136 that are adjacent to connectors 66A and 66B. Following shrinkage of attachment structures 76, connectors 66A and 66B will be drawn together as shown in FIG. 29.

Figure 30:
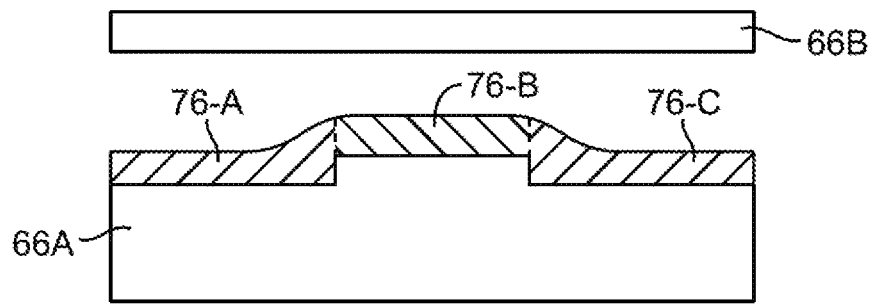
FIG. 30 is a cross-sectional side view of illustrative structures that may be joined using expandable material with localized regions of different expandability in accordance with an embodiment.
Figure 31:
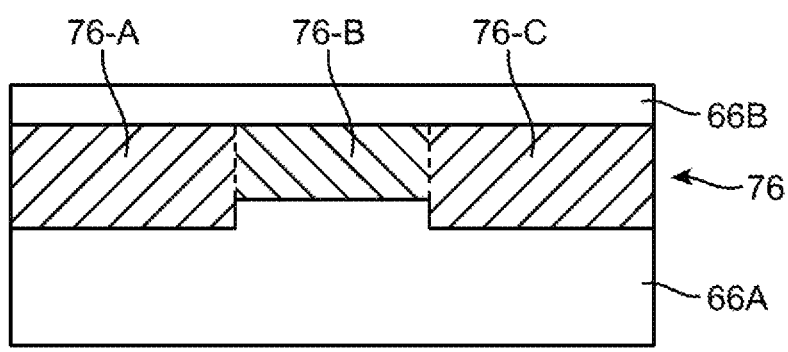
FIG. 31 is a cross-sectional side view of the illustrative structures of FIG. 30 following expansion of the expandable material in accordance with an embodiment.

FIG. 30 shows how an attachment structure may have regions that are configured to expend by different amounts (e.g., due to different chemical compositions and/or different amounts or types of materials, or other structural and/or chemical differences). In particular, the attachment structure of FIG. 30 has attachment structure regions 76-A, 76-B, and 76-C. Structure 66A has a surface with different heights corresponding to the different regions of the attachment structure. The different heights of structure 66A may be due to the presence of integrated circuits or other components, may be due to the shape of a plastic or metal member that forms structure 66A, or may be due to the presence of other structures. Initially, structures 66A and 66B may be disassembled, as shown in FIG. 30. Following heating of attachment layer 76, each of the regions of structure 76 may expand differently (i.e., region 76-A and region 76-C may expand more than region 76-B) due to the different properties of each attachment structure region. This can help accommodate height differences or other features in structures 66A and 66B when joining structures 66A and 66B.

Figure 32:
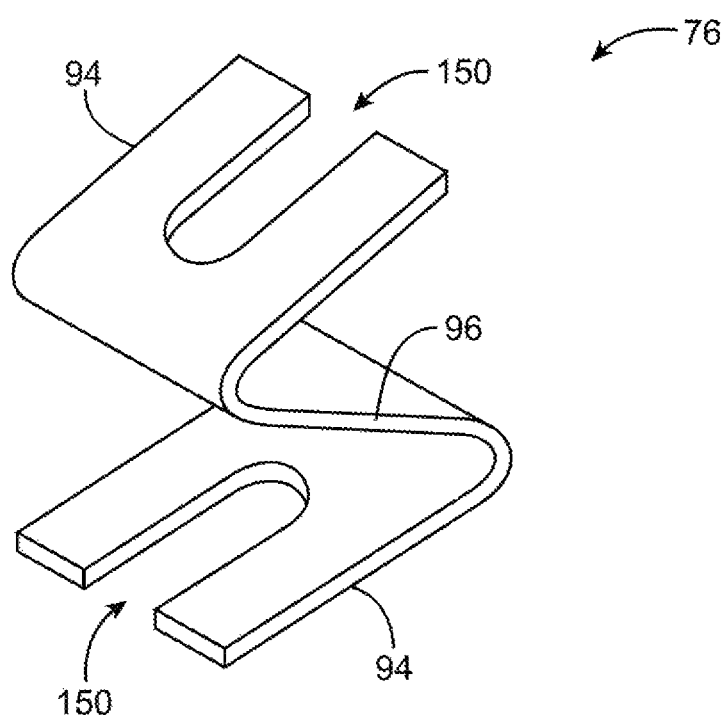
FIG. 32 is a perspective view of an illustrative clip formed from a material that expands or contracts in accordance with an embodiment.
Figure 33:
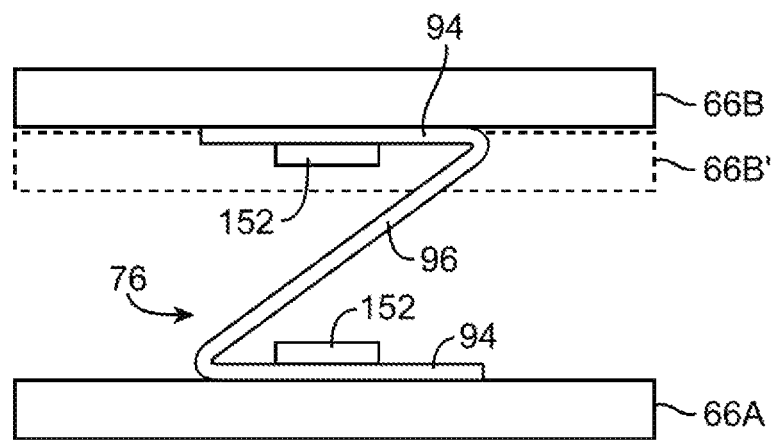
FIG. 33 is a cross-sectional side view of the illustrative clip of FIG. 32 after shrinking the clip to pull device structures towards each other in accordance with an embodiment.

FIG. 32 is a perspective view of a clip-type attachment structure. Attachment structure 76 of FIG. 32 has horizontal portions 94 with groove-shaped openings 150. Portions 94 may be coupled together using diagonal portion 96. As shown in FIG. 33, openings 150 may receive screws 152 or other structures that secure horizontal portions 94 to structures 66A and 66B. Clip-based attachment structure 76 of FIG. 33 may be configured to expand when exposed to heat or other treatment or may be configured to contract when exposed to heat or other treatment. When structure 76 contracts, structure 66B and structure 66A will be drawn towards each other (e.g., to ensure that structures 66A and 66B mate, as described in connection with the board-to-board connectors of FIGS. 26 and 27). As shown in FIG. 33, for example, structure 66B may be pulled into position 66B'.

Figure 34:
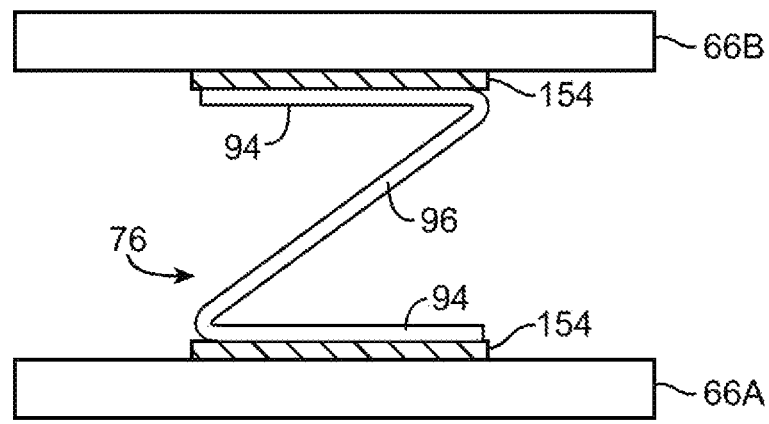
FIG. 34 is a cross-sectional side view of the clip structure of FIG. 33 that has been attached to device structures using adhesive in accordance with an embodiment.

FIG. 34 shows how adhesive 154 (e.g., cured liquid adhesive, pressure sensitive adhesive, etc.) may be used in securing portions 94 of attachment structure 76 to structures 66A and 66B. Welds, solder, fasteners, molded plastic, tacky surfaces, and other engagement structures may also be used to secure attachment structures 76 to structures 66.

Figure 35:
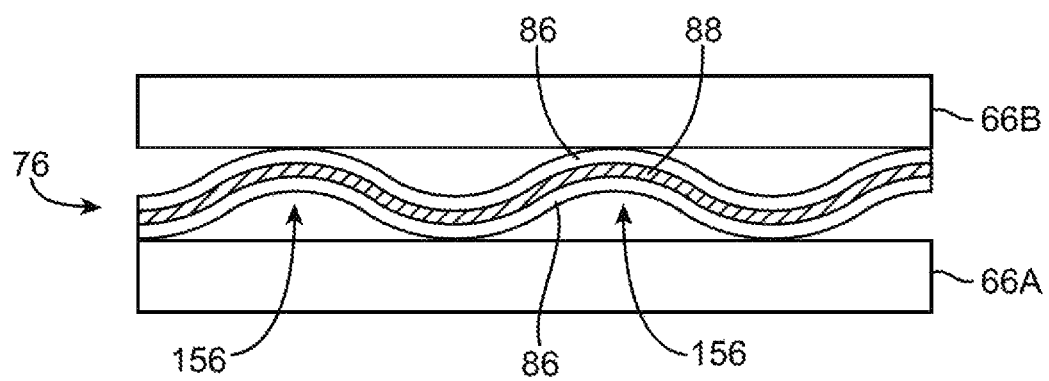
FIG. 35 is a cross-sectional side view of an illustrative attachment structure formed from a corrugated member based on an expandable or shrinkable material that can be used to couple a pair of device structures together in accordance with an embodiment
Figure 36:
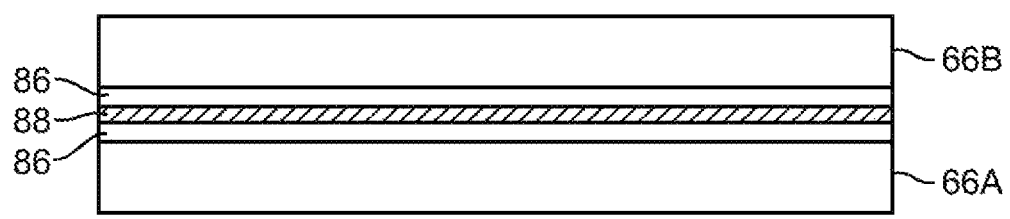
FIG. 36 is a cross-sectional side view of the illustrative corrugated member of FIG. 35 following heating to flatten the corrugated member and thereby draw the structures of together in accordance with an embodiment.

In the illustrative configuration of FIG. 35, attachment structure 76 includes a corrugated sheet such as sheet 88. Sheet 88 may be formed from a layer of interwoven shape memory metal fibers, a solid shape memory metal layer, a solid plastic layer or a sheet with interwoven plastic fibers, or other material that changes shape when treated (e.g., when heated). Sheet 88 may initially have undulations such as undulations 156. Adhesive 86 (e.g., pressure sensitive adhesive) may be used to couple sheet 88 to structures 66A and 66B. Initially, attachment structure 76 of FIG. 35 is in its corrugated shape (in this example). Following application of heat or other treatment, undulations 156 are removed from sheet 88. This pulls structures 66A and 66B towards each other so that structures 66A and 66B are attached to each other as shown in FIG. 36. If desired, sheet 88 may initially be flat and may change into a corrugated shape upon application of heat or other treatment.

Figure 37:
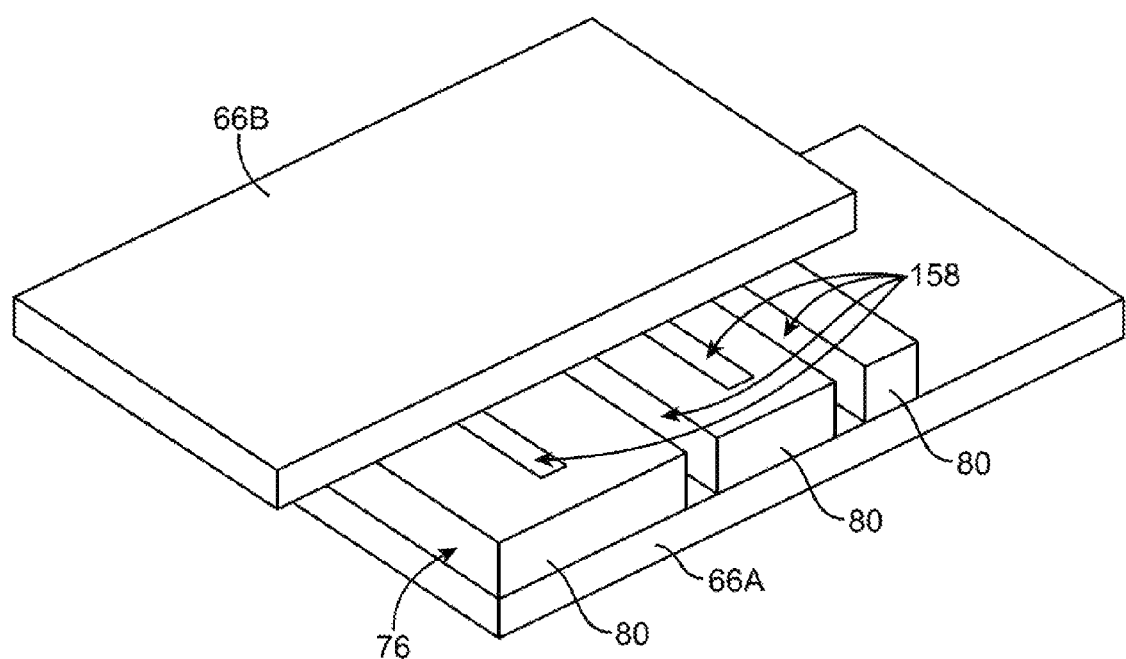
FIG. 37 is an exploded perspective view of an illustrative device structure that is being mounted to another device structure using a material with channels that promote liquid evaporation in accordance with an embodiment.

If desired, attachment structures 76 may include channels. As shown in the exploded perspective view of FIG. 37, for example, material 80 (e.g., a sheet of foam or other polymer) may have openings such as channels 158. Channels 158 may help chemicals (e.g., adhesive, solvent, catalyst) enter and exit material 80. As an example, channels 158 may be used to help evaporate solvent from material 80 as part of a heat treatment of attachment structure 76. Adhesive may be placed in some of channels 158 and, if desired, reactant can enter the interior of material 80 using other channels (as an example). Combinations of these arrangements and other arrangements may be used, if desired.

Figure 38:
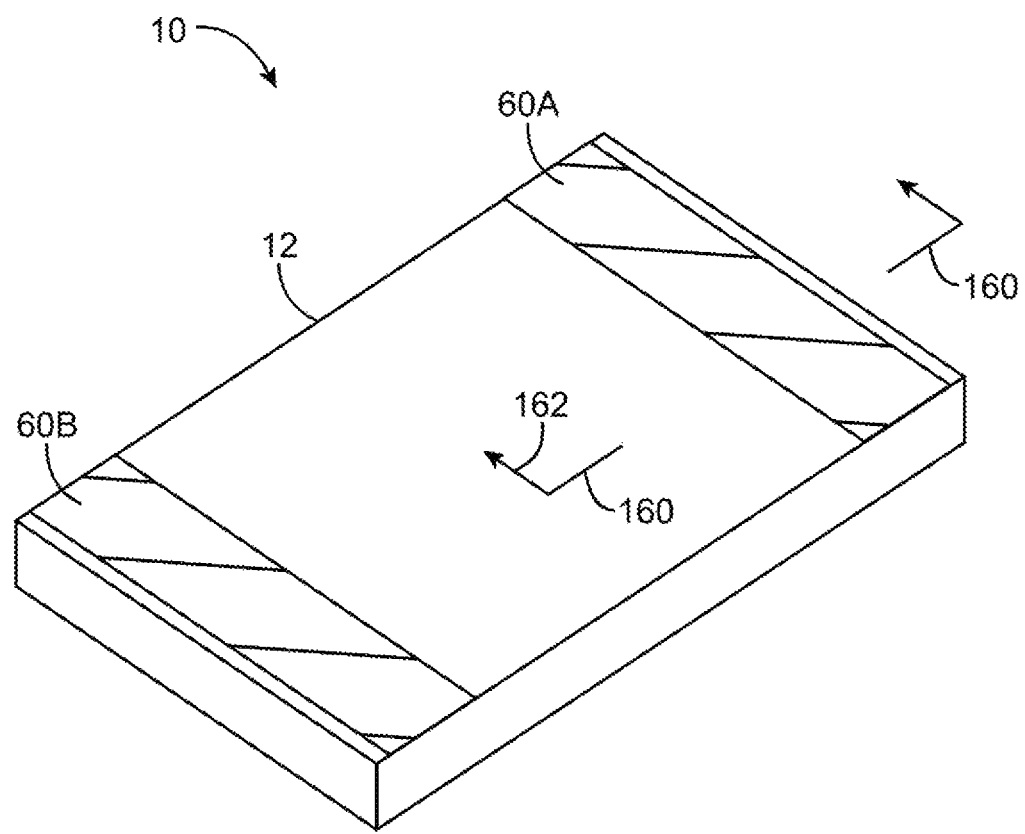
FIG. 38 is a perspective view of an illustrative electronic device with antenna windows in accordance with an embodiment.

A perspective view of device 10 in an illustrative configuration in which device 10 has a pair of antenna windows at the opposing upper and lower ends of housing 12 is shown in FIG. 38. As shown in FIG. 38, device 10 may have a first antenna window or other structure mounted in housing 12 such as antenna window 60A and may have a second antenna window or other structure mounted in housing 12 such as antenna window 60B. Windows 60A and 60B may be device structures formed from plastic, glass, ceramic, crystalline materials such as sapphire, or other materials.

Figure 39:
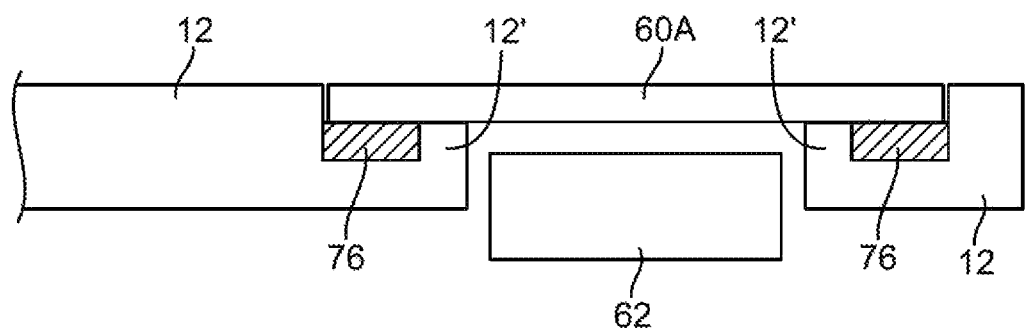
FIG. 39 is a cross-sectional side view of a portion of an illustrative electronic device in which a structure is being mounted in a housing wall using an attachment structure formed from shrinkable material in accordance with an embodiment.

A cross-sectional side view of device 10 of FIG. 38 taken along line 160 and viewed in direction 162 is shown in FIG. 39. As shown in FIG. 39, window structures 60A may be pulled against housing 12 using contacting attachment structures 76. Portions 12' of housing 12 may serve as stops that define the position of structure 60A (i.e., the opposing surfaces of portions 12' and structure 60A may define the position of structure 60A). Component 62 may be an antenna that is overlapped by antenna window structure 60A. If desired, an arrangement of the type shown in FIG. 39 may be used to mount other structures within housing 12. For example, a lens or other structure such as lens 58 of FIG. 5 may be mounted in housing 12 in alignment with internal light-based component 56. In general, any suitable device structures 66 may be mounted to each other using attachment structures 76. The use of attachment structures 76 to pull together window structures and housing structures, connectors, and other illustrative device structures 66 is merely illustrative.

The foregoing is merely illustrative and various modifications can be made by those skilled in the art without departing from the scope and spirit of the described embodiments. The foregoing embodiments may be implemented individually or in any combination.

What is claimed is:

1. Apparatus, comprising:
   a first electronic device structure;
   a second electronic device structure; and
   a shrinkable attachment structure that draws the first electronic device structure into contact with the second electronic device structure, wherein the second electronic device structure has a stop structure with a surface that arrests motion of the first electronic device structure relative to the second electronic device structure due to shrinking the shrinkable attachment structure.

2. The apparatus defined in claim 1 wherein the first electronic device structure comprises glass.

3. The apparatus defined in claim 2 wherein the second electronic device structure comprises a metal electronic device housing structure.

4. The apparatus defined in claim 1 wherein the shrinkable attachment structure comprises foam.

5. The apparatus defined in claim 4 wherein the shrinkable attachment structure comprises adhesive that attaches the foam to the first and second electronic device structures.

6. The apparatus defined in claim 1 wherein the shrinkable attachment structure comprises a clip.

7. The apparatus defined in claim 6 wherein the clip is formed from a material selected from the group consisting of: a polymer and a shape memory metal.

8. The apparatus defined in claim 1 wherein the shrinkable attachment structure comprises a corrugated sheet.

9. The apparatus defined in claim 8 further comprising adhesive coatings on the corrugated sheet that attach the corrugated sheet between the first and second electronic device structures.

10. The apparatus defined in claim 1 wherein the first electronic device structure is a first connector and wherein the second electronic device structure is a second connector that is configured to mate with the first connector so that contacts in the first connector couple to contacts in the second connector.

11. The apparatus defined in claim 10 wherein the shrinkable attachment structure comprises a polymer and is coupled between a portion of the first connector and a portion of the second connector.

12. The apparatus defined in claim 10 further comprising:
   a first printed circuit on which the first connector is mounted; and
   a second printed circuit on which the second connector is mounted, wherein the shrinkable attachment structure comprises a polymer and is coupled between a portion of the first printed circuit and a portion of the second printed circuit.

13. An electronic device, comprising:
a first electronic device structure having a first surface;
a second electronic device structure having a stop structure with a second surface; and
a heat-activated shrinkable attachment structure that shrinks to pull the first electronic device structure towards the second electronic device structure when heated so that the first surface contacts the second surface and thereby prevents further motion of the first electronic device structure relative to the second electronic device structure.

14. An electronic device, comprising:
a first electronic device structure having a first surface;
a second electronic device structure having a stop structure with a second surface; and
a heat-activated shrinkable attachment structure that pulls the first electronic device structure towards the second electronic device structure when heated so that the first surface contacts the second surface and thereby prevents further motion of the first electronic device structure relative to the second electronic device structure, wherein the second electronic device structure comprises a recess, and wherein the heat-activated shrinkable attachment structure is in the recess.

15. The electronic device defined in claim 14 wherein the heat-activated shrinkable attachment structure comprises foam.

* * * * *